(12) United States Patent
Abu-Ageel

(10) Patent No.: US 7,360,936 B2
(45) Date of Patent: Apr. 22, 2008

(54) METHOD AND SYSTEM OF LED LIGHT EXTRACTION USING OPTICAL ELEMENTS

(76) Inventor: Nayef M. Abu-Ageel, 10 Primrose Way, Apt.#3101, Haverhill, MA (US) 01830

( * ) Notice: Subject to any disclaimer, the term of this patent is extended or adjusted under 35 U.S.C. 154(b) by 0 days.

(21) Appl. No.: 11/534,217

(22) Filed: Sep. 22, 2006

(65) Prior Publication Data

US 2007/0012934 A1     Jan. 18, 2007

Related U.S. Application Data

(63) Continuation of application No. PCT/US2006/036933, filed on Sep. 21, 2006, and a continuation-in-part of application No. 10/458,390, filed on Jun. 10, 2003, and a continuation-in-part of application No. 11/317,189, filed on Dec. 22, 2005, and a continuation-in-part of application No. 11/066,605, filed on Feb. 25, 2005, and a continuation-in-part of application No. 11/066,616, filed on Feb. 25, 2005, and a continuation-in-part of application No. 11/067,591, filed on Feb. 25, 2005.

(51) Int. Cl.
    *F21V 7/04*    (2006.01)
(52) U.S. Cl. .............. 362/555; 362/613; 362/800; 362/339; 257/95; 385/133
(58) Field of Classification Search ............. 362/555, 362/613, 800, 339; 385/133; 257/95
    See application file for complete search history.

(56) References Cited

U.S. PATENT DOCUMENTS 5,271,077 A    12/1993    Brockman et al.
5,396,350 A    3/1995    Beeson et al.
5,414,600 A    5/1995    Strobl et al.
5,430,634 A    7/1995    Baker et al.
5,498,928 A    3/1996    Lapatovich
5,598,281 A    1/1997    Zimmerman et al.
5,773,918 A    6/1998    Dolan et al.
5,779,924 A    7/1998    Krames et al.
6,144,536 A    11/2000    Zimmerman et al.
6,509,675 B2    1/2003    MacLennan et al.
6,554,456 B1    4/2003    Buelow et al.
6,560,038 B1    5/2003    Parkyn et al.
6,734,638 B2    5/2004    Kang et al.
6,791,270 B2    9/2004    Kim et al.
6,831,302 B2    12/2004    Erchak et al.
6,873,119 B2    3/2005    Kim et al.
6,949,772 B2 *    9/2005    Shimizu et al. .............. 257/99

OTHER PUBLICATIONS

Schnitzer, I. et al., "30% External Quantum Efficiency from Surface Textured, Thin-Film Light-Emitting Diodes", Applied Physics Letter 63, 1993, pp. 2174-2176.

* cited by examiner

*Primary Examiner*—Sandra O'Shea
*Assistant Examiner*—Jessica L McMillan
(74) *Attorney, Agent, or Firm*—Gavrilovich, Dodd & Lindsey LLP

(57) ABSTRACT

A light extraction plate can be used with a light emitting diode (LED) to efficiently extract and provide control over the spatial distribution of extracted light in terms of intensity and angle. The extraction plate can have millions of optical micro-elements and can be manufactured independently of the LED using conventional integrated circuit (IC) fabrication techniques. The extraction plate is preferably attached or bonded to an LED surface.

18 Claims, 10 Drawing Sheets

METHOD AND SYSTEM OF LED LIGHT EXTRACTION USING OPTICAL ELEMENTS

RELATED APPLICATIONS

This application is a continuation of International Application No. PCT/US2006/036933, filed on Sep. 21, 2006.

This application is a continuation-in-part of:
(1) U.S. patent application Ser. No. 10/458,390 filed on Jun. 10, 2003, titled "Light Guide Array, Fabrication Methods, and Optical System Employing Same";
(2) U.S. patent application Ser. No. 11/066,605, titled "Compact Polarization Conversion System for Optical Displays," filed on Feb. 25, 2005;
(3) U.S. patent application Ser. No. 11/066,616, titled "Compact Projection System Including a Light Guide Array," filed on Feb. 25, 2005;
(4) U.S. patent application Ser. No. 11/067,591, titled "Light Recycler and Color Display System Including Same," filed on Feb. 25, 2005; and
(5) U.S. patent application Ser. No. 11/317,189, titled "Light Recovery System and Display Systems Employing Same", filed on Dec. 22, 2005.

This application is also related to the following patent applications:
(1) U.S. Patent Application No. 60/719,155, titled "Compact Light Collection Systems", filed on Sep. 21, 2005; and
(2) U.S. patent application Ser. No. 11/232,310, titled "Method and Apparatus for Reducing Laser Speckle", filed on Sep. 21, 2005.

The subject matter of all of the aforementioned applications is hereby incorporated by reference as though set forth herein in full.

TECHNICAL FIELD

The invention relates generally to light emitting diodes (LEDs), and more particularly, to optical devices for extracting and conditioning light emitted from light emitting diodes.

BACKGROUND

Light emitting diodes (LEDs) are considered attractive light sources for various applications such as such as traffic signals, displays, automobile headlights and taillights and conventional indoor lighting. LEDs are generally more reliable and efficient than other light sources, such as incandescent bulbs.

However, with LEDs only a small portion (about 2%) of light generated within the LED active layer can be extracted and utilized while the remaining part is absorbed within the LED structure itself. This is due to the difficulty for light to be extracted from LED semiconductor materials, which have a relatively high index of refraction. Typical LED semiconductors have index of refraction ranging from 2.2 to 3.8, which is high when compared to that of ambient air (about 1.0).

Many methods for increasing the LED efficiency (i.e., extracting more light from the LED active layer) have been reported. Shnitzer, et al. in "30% External Quantum Efficiency From Surface Textured, Thin Film Light Emitting Diodes", Applied Physics Letters 63, 1993, pp. 2174-2176, propose a method of introducing random nanotexturing on the LED's surface. Since the introduced features are on the order of the wavelength of light, the light behavior becomes chaotic leading to enhanced LED efficiency.

Other methods introduce periodic or non-periodic patterns (rather than random texturing) on the order of light wavelength to the emitting surface or internal interfaces of the LED. Due to interference effects, more light is extracted from the LED active layer leading to enhanced efficiency. Examples of this method are discussed in U.S. Pat. No. 5,779,924 to Krames et al. and U.S. Pat. No. 6,831,302 B2 to Erchak et al.

Shnitzer, et al. in "Ultrahigh Spontaneous Emission Quantum Efficiency, 99.7% Internally and 72% Externally, From AlGaAs/GaAs/AlGaAs Double Heterostructures", Applied Physics Letters 62, 1993, pp. 131-133, propose photon recycling for extracting more light from the LED. This method requires materials with extremely low optical loss and the use of a non-absorbing current spreading layer on the LED surface.

In another approach, Parkyn, Jr. et al. in U.S. Pat. No. 6,560,038 B1 propose the use of light pipes to extract more light from the LED. Krames, et al. in "High Power Truncated Inverted Pyramid $(Al_x Ga_{1-x})_0.5 In_0.5$ P/GaP Light Emitting Diodes Exhibiting >50% External Quantum Efficiency," Applied Physics Letters 75, 1999, teach the angling of the LED chip's side surfaces to create an inverted truncated pyramid and thus enhance the extraction efficiency.

Although they represent an improvement over plain LEDs, known methods for enhancing LED light extraction suffer from one or more of the following disadvantages: (a) added complexity to the LED fabrication process, (b) relatively high manufacturing cost, (c) and limited control over the spatial distribution of light in terms of angle and intensity.

Therefore, there is a need for simple, low cost and efficient light extraction system that provides control over spatial distribution of LED light in terms of intensity and angle.

SUMMARY

It is an advantage of the present invention to provide a simple, low cost and efficient light extraction system capable of producing a light beam of selected cross-section and selected spatial distribution of light in terms of intensity and angle.

In accordance with an exemplary embodiment of the invention, the light extraction system uses millions of optical micro-elements formed on an extraction plate to extract and collimate LED light. The extraction plate is manufactured separately using conventional IC fabrication techniques, and then attached or bonded to an LED surface.

In addition to the embodiments described herein, other embodiments, features, aspects, advantages, systems and methods of the invention will be or will become apparent to one with skill in the art upon examination of the following drawings and detailed description. It is intended that all such additional embodiments, features and advantages be included within this description, be within the scope of the invention, and be protected by the accompanying claims.

BRIEF DESCRIPTION OF THE DRAWINGS

It is to be understood that the drawings are solely for purposes of illustration and not as a definition of the limits of the invention. Furthermore, the components in the figures are not necessarily to scale, emphasis instead being placed upon illustrating the principles of the invention. In the figures, like reference numerals designate corresponding parts throughout the different views.

DETAILED DESCRIPTION

The following detailed description, which references to and incorporates the drawings, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1A:
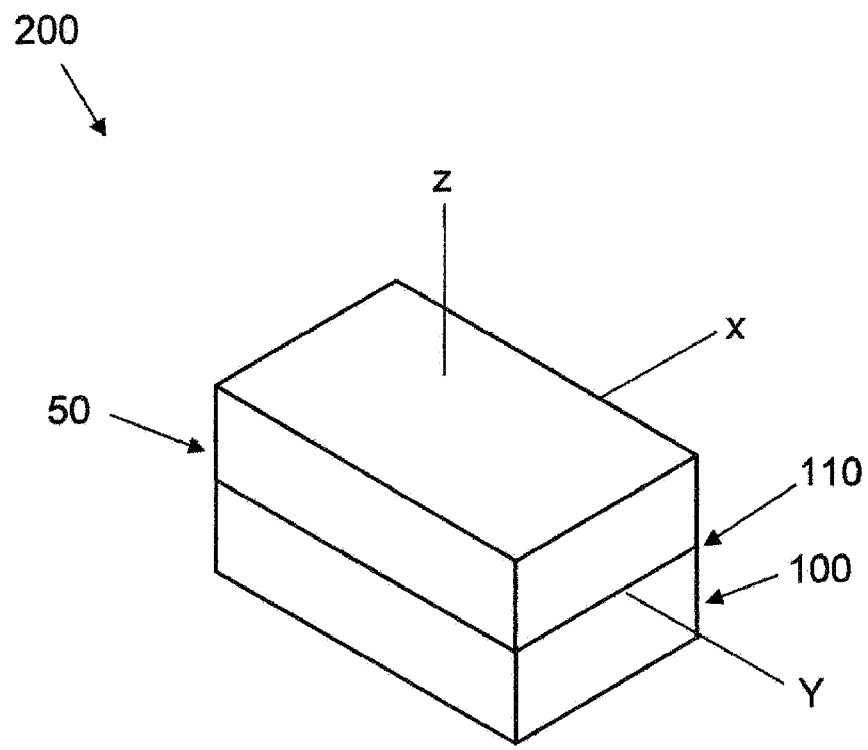
FIG. 1A shows a perspective view of a light extraction system utilizing an extraction plate and LED.

FIGS. 1A and B show perspective views of LED light extraction systems 200 and 250, respectively, in accordance with exemplary embodiments of the invention.

The LED light extraction system 200 (FIG. 1A) includes a light emitting diode (LED) 100 and an extraction plate 50.

The LED light extraction system 250 (FIG. 1B) includes the LED 100, an encapsulating epoxy layer 120 applied to the emitting surface 110 of LED 100 and an extraction plate 50.

Extraction plate 50 is bonded directly or attached to the emitting surface 110 (FIG. 1A) or to the encapsulation epoxy layer 120 (FIG. 1B) of LED 100 using a thin transparent adhesive. The adhesive can be a continuous adhesive layer that covers the whole emitting surface 110 or epoxy layer 120, or alternatively, it may be a patterned adhesive layer that covers only part of the surface 110. Suitable adhesives are well known to those skilled in the art.

The extraction plate 50 can have a size equal or smaller than the size of the emitting surface of the LED 100 and its shape can be rectangular, square, circular or any other suitable shape.

The LED 100 is any type, structure or color of LED formed on a suitable semiconductor substrate. Although a single LED is depicted in the figures, the invention is not limited to this particular arrangement. The extraction plates disclosed herein can also be applied to arrays of plural LEDs formed on a common semiconductor substrate.

Figure 2A:
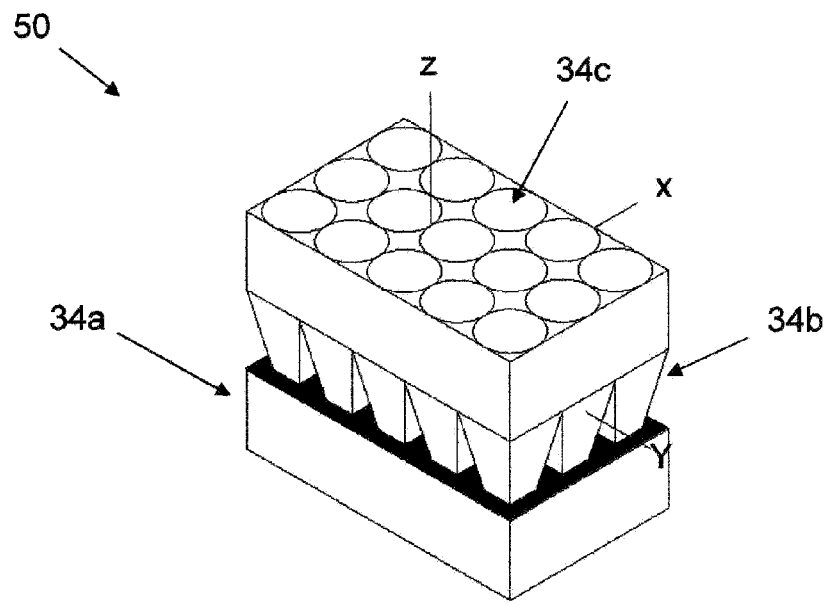
FIG. 2A shows a perspective view of an extraction plate comprising a micro-aperture, micro-waveguide and micro-lens arrays.
Figure 2B:
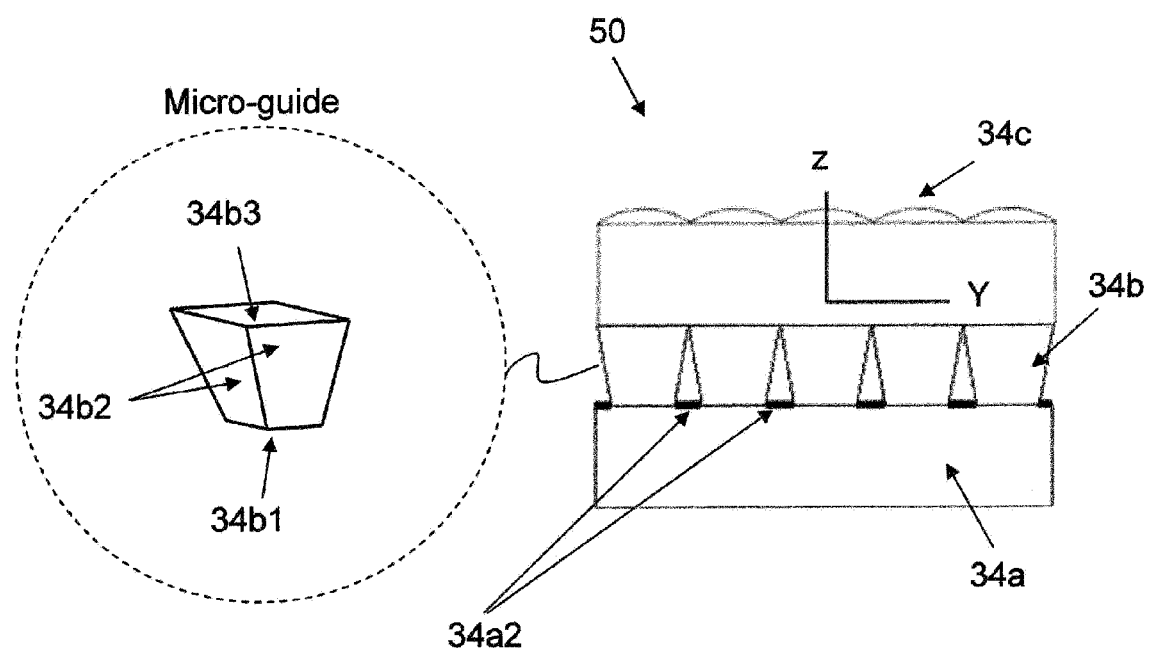
FIG. 2B shows a cross sectional view of the extraction plate shown in FIG. 2A.

FIG. 2A shows a perspective view of the extraction plate 50, which comprises an aperture plate 34a, micro-waveguide array 34b and a micro-lens array 34c. Each micro-lens corresponds to a micro-waveguide and a micro-aperture. The optical axes of the micro-waveguides and micro-lenses are substantially orthogonal to the LED's light emitting surface 110. As shown in FIG. 2D, the aperture array 34a consists of a plate 34a1 made of a highly light-transmissive material with a patterned highly reflective coating 34a2 applied to its top surface. The index of refraction of array 34a (i.e., the plate material) is preferably equal or larger than the index of refraction of the LED semiconductor material, e.g., the light emitting layer of the LED material.

Figure 2C:
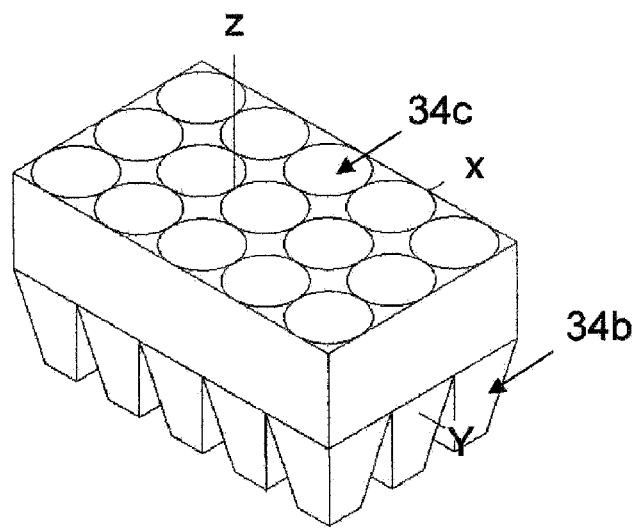
FIGS. 2C-2D show exploded views of the extraction plate of FIG. 2A.
Figure 2D:
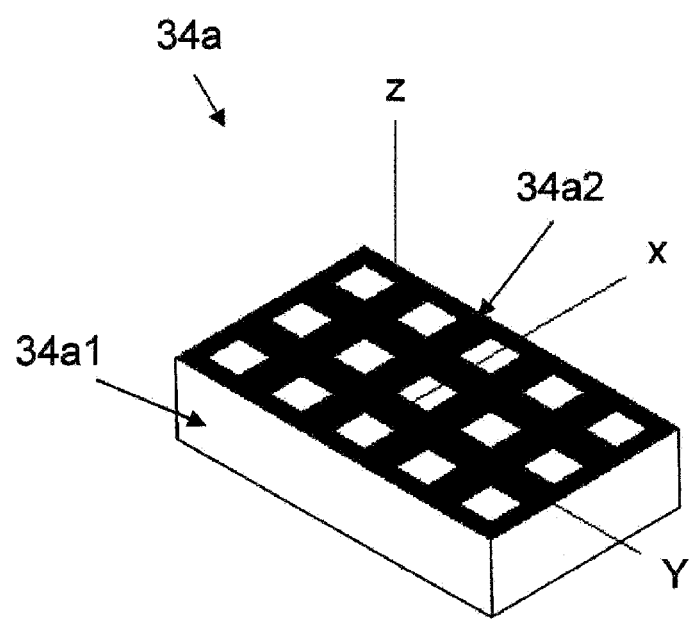

A perspective view of the micro-waveguide array 34b and micro-lens array 34c is shown in FIG. 2C. Both arrays 34b and 34c can be made on a single plate of transparent material with a refractive index preferably equal or larger than the index of refraction of the LED semiconductor material. A cross-sectional view of the aperture 34a, micro-waveguide 34b and micro-lens 34c arrays is shown in FIG. 2B.

Design parameters of each optical element (e.g., micro-waveguide, micro-lens, micro-apertures, or micro-tunnel) within an array 34a, 34b and 34c include shape and size of entrance and exit apertures, depth, sidewalls shape and taper, and orientation. Optical elements within an array 34a, 34b and 34c can have uniform, non-uniform, random or non-random distributions and range from one optical element to millions of micro elements. The optical elements can have a uniform individual structure, or each optical element can be distinct in its structure and/or design parameters. Combinations of uniform and distinct optical elements can be employed in the arrays disclosed herein. The spatial distribution of output radiation of the system 200 or 250 can be varied by changing the arrangement, uniformity, designs, number and density of the optical elements included in the extraction plate 50.

The size of the entrance/exit aperture of each optical element is preferably greater than or equal to 5 μm in diameter in case of visible light in order to avoid light diffraction phenomenon. However, it is possible to design optical elements with sizes of entrance/exit aperture being less than 5 μm. In such case, the design should consider the diffraction phenomenon and behavior of light at such scales to provide homogeneous light distributions in terms of intensity, viewing angle and color over a certain area.

The optical elements can be arranged as a one-dimensional array, two-dimensional array, circular array and can be aligned or oriented individually.

Figure 2E:
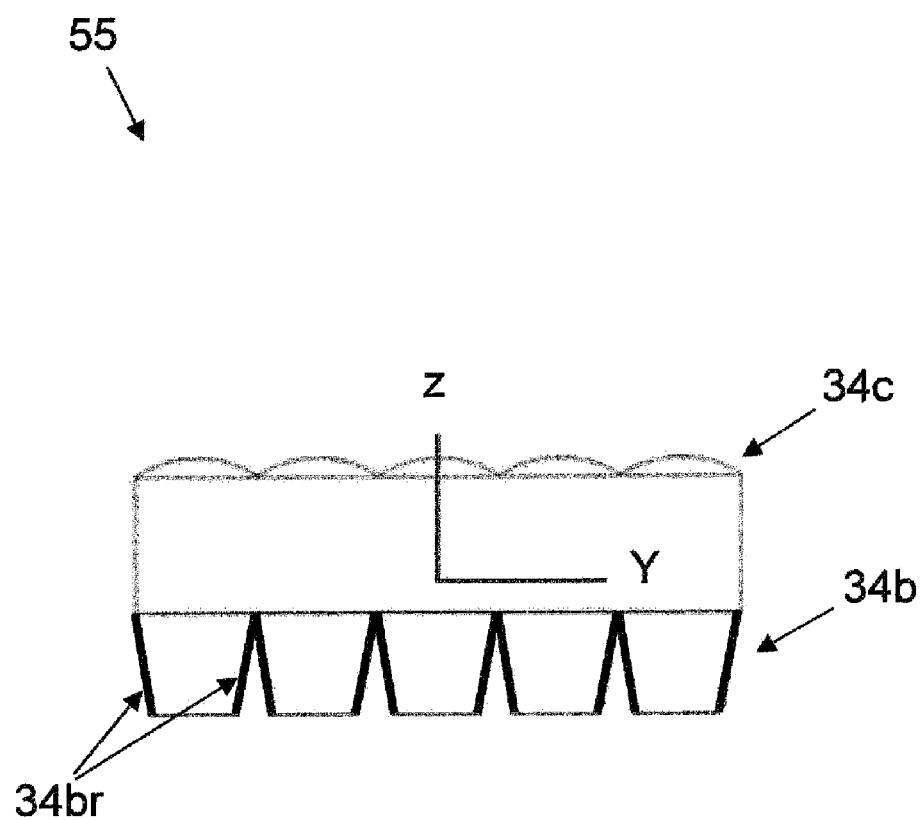
FIG. 2E shows a cross sectional view of the extraction plate of FIG. 2A with a highly reflective specular coating applied to the sidewalls of its micro-waveguides.

In an alternative arrangement, as shown in FIG. 2E, the extraction plate 55 does not include the aperture array 34a. Instead, the sidewalls of the micro-waveguides within micro-waveguide array 34b are coated with a highly reflective coating 34br.

The operation of the extraction plates 50 and 55 is described as follows. Some of the light emitted from the LED 100 and impinging on the extraction plate 50 or 55 enters through the openings of the aperture array 34a and the remainder is reflected back into the LED 100 by the highly reflective coating 34a2 and 34br. Some of this reflected light gets absorbed and lost within the LED 100, some gets absorbed and regenerated with a different angle, and the remainder gets reflected back toward the extraction plate 50 and 55 by a reflective coating formed on the bottom side of the LED 100 and/or by total internal reflection (TIR) within the LED 100, depending on the LED structure. This process continues until all the light is either absorbed or transmitted through the extraction plate 50 or 55. Light received by the micro-waveguide array 34b experiences total internal reflection (or specular reflection in case of extraction plate of FIG. 2E) within the micro-waveguides and becomes highly collimated as it exits array 34b in the general direction of the z-axis. This collimated light exits the micro-lens array 34c via refraction, which further collimates the output light. In addition to increasing the amount of light extracted, extraction plate 50 and 55 provides control over the distribution of output light in terms of intensity and cone angle at the location of each element.

Figure 1B:
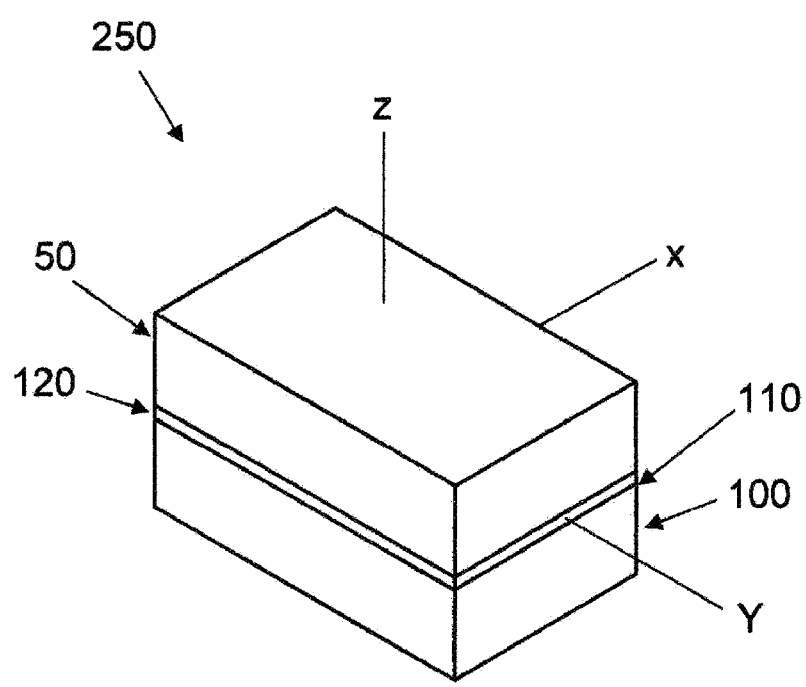
FIG. 1B shows a perspective view of a light extraction system utilizing an extraction plate, encapsulating epoxy and LED.

FIGS. 3A-5C show alternative extraction plates structures 60, 70, 80 that can be substituted for the extraction plate 50 shown in FIGS. 1A-B.

Figure 3A:
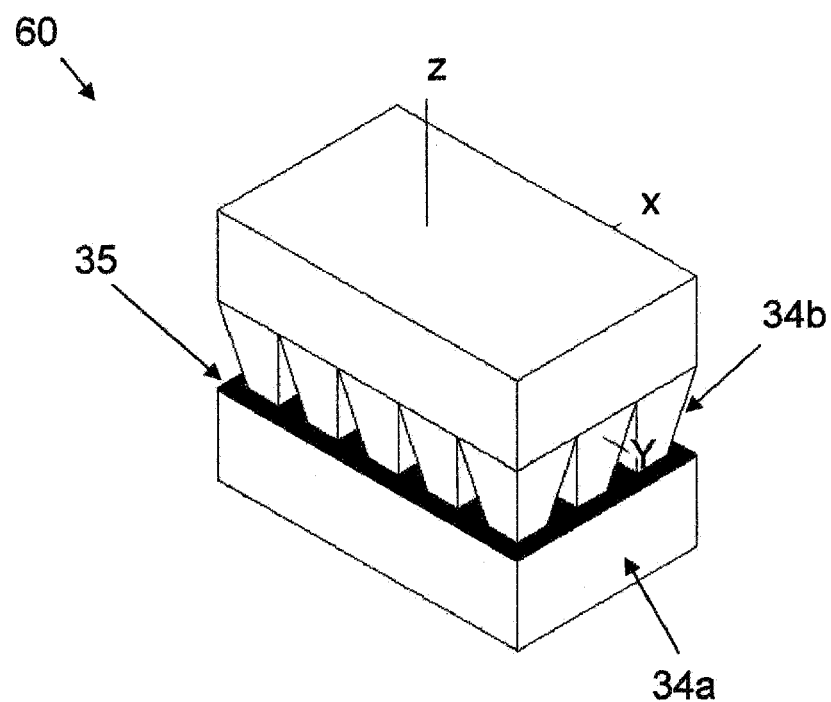
FIG. 3A shows a perspective view of an alternative extraction plate comprising micro-aperture and micro-waveguide arrays.
Figure 3B:
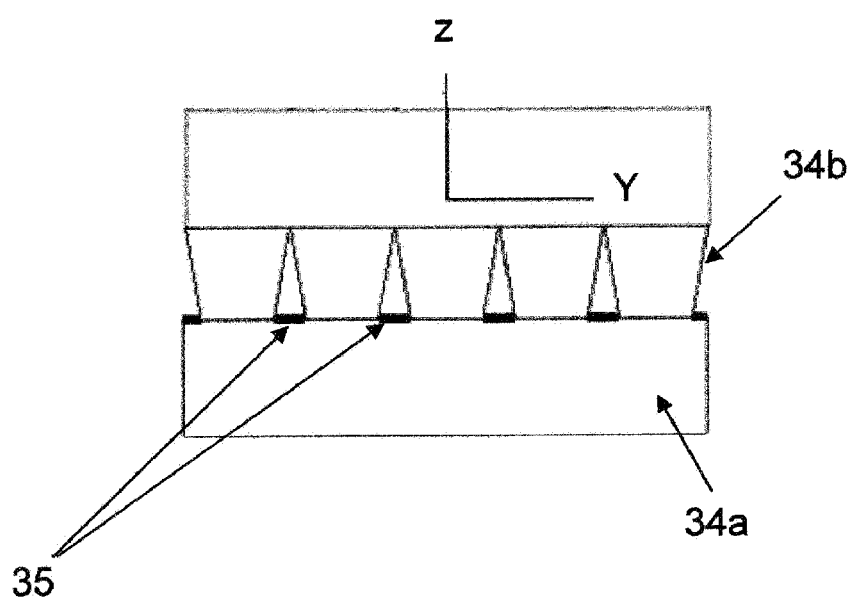
FIG. 3B shows a cross sectional view of the extraction plate shown in FIG. 3A.

FIGS. 3A and 3B show perspective and cross sectional views of extraction plate 60 comprising only a micro-waveguide array 34b and an aperture array 34a, without the micro-lens array 34c. The aperture array 34a has a patterned highly reflective coating 35 applied to its top surface.

Figure 4A:
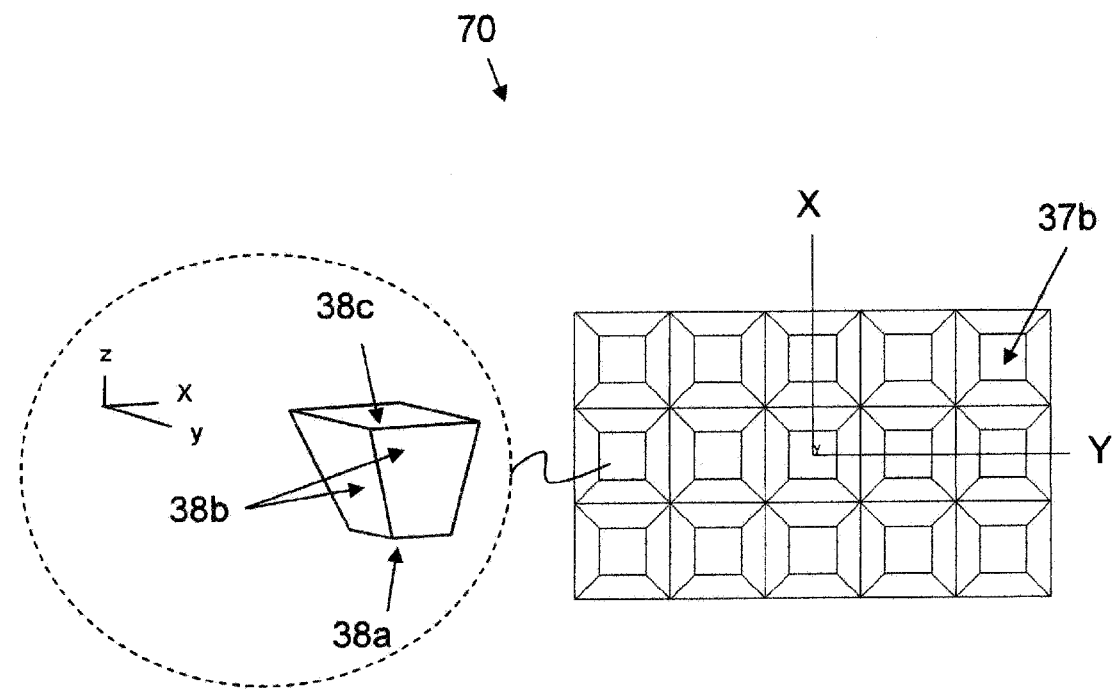
FIG. 4A shows a top view of another extraction plate comprising micro-aperture and micro-tunnel arrays.
Figure 4B:
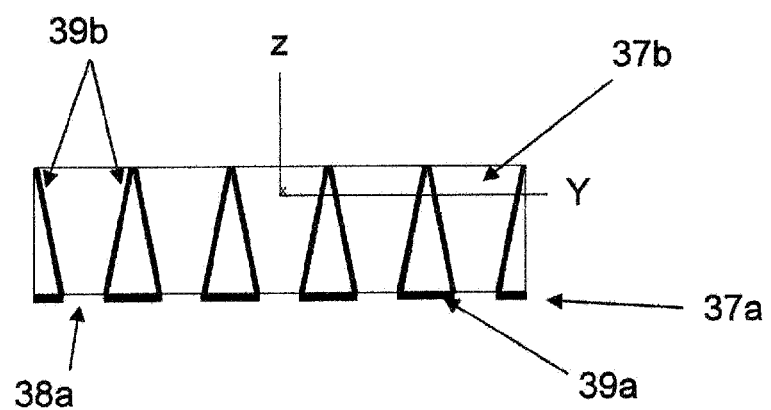
FIG. 4B shows a cross sectional view of the extraction plate shown in FIG. 4A.

FIGS. 4A and 4B show perspective and cross sectional views of an alternative extraction plate 70 comprising of a micro-tunnel array 37b and an aperture array 37a. The internal sidewalls 38b (exploded view of FIG. 4A) of each micro-tunnel are coated with a highly reflective coating 39b (FIG. 4B). Part of the light impinging on extraction plate 70 enters the hollow micro-tunnel array 37b and gets collimated via reflection off of the sidewalls 38b. The remainder of this light gets reflected back into the LED 100 by the highly reflective coating 39a of aperture array 37a. The advantages of extraction plate 70 are compactness and high transmission efficiency of light without the need for anti-reflective (AR) coatings at the exit 38c apertures of its micro-tunnels.

In another configuration, micro-tunnels of array 37b are filled with a high-refractive index material. The filled micro-tunnels allow more LED light to enter the micro-tunnels compared to the hollow micro-tunnels.

Figure 5A:
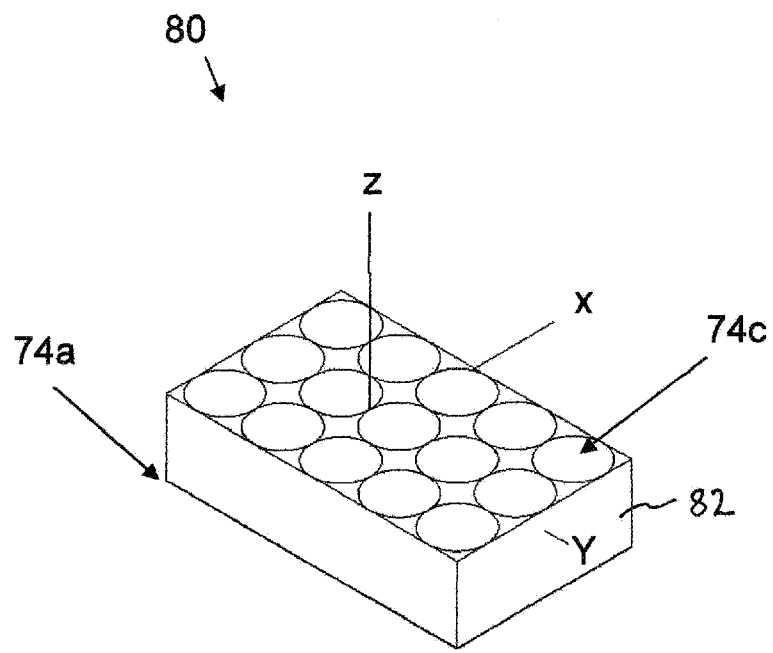
FIG. 5A shows a perspective view of another alternative extraction plate comprising micro-aperture and micro-lens arrays.
Figure 5B:
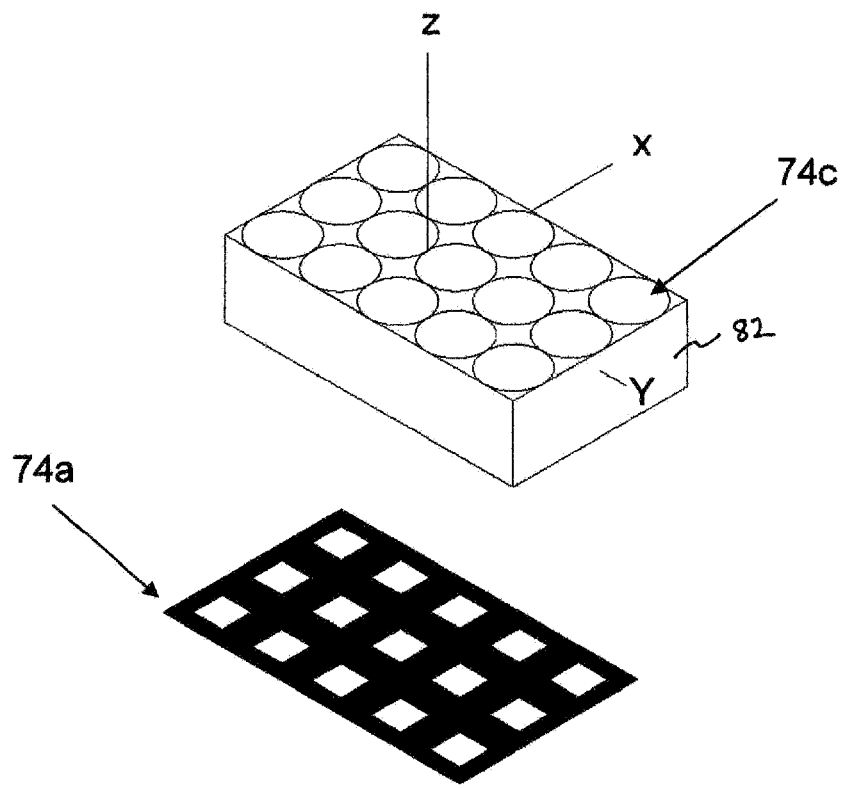
FIG. 5B shows an exploded view of the extraction plate shown in FIG. 5A.
Figure 5C:
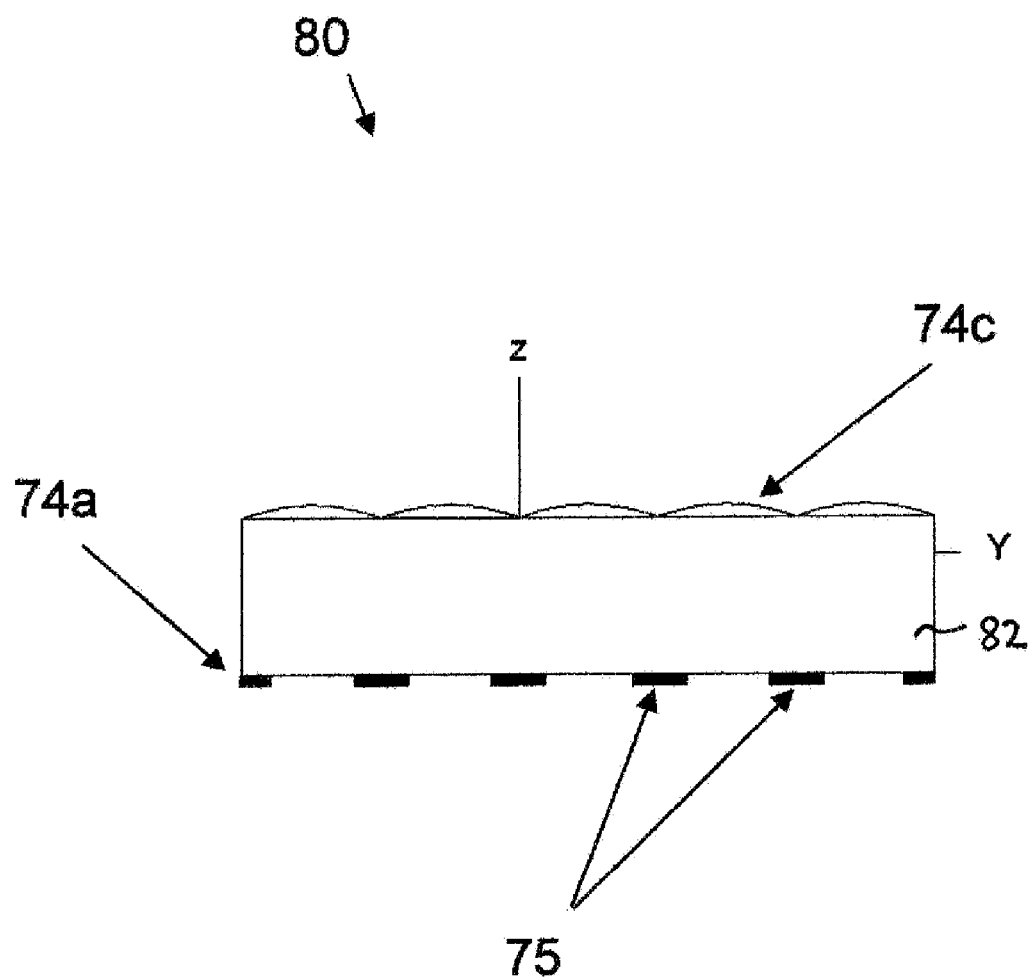
FIG. 5C shows a cross sectional view of the extraction plate shown in FIG. 5A.

FIGS. 5A, 5B and 5C show integrated and exploded perspective views and cross-sectional views, respectively, of an extraction plate 80. The extraction plate 80 comprises an aperture array 74a and a micro-lens array 74c made on a single light-transmissive plate 82. In this case, the micro-lens array 74c performs the collimation function of output light via micro-lens refraction.

The reflective coatings 33a2, 35, 39a, and 75 of aperture arrays 34a (FIGS. 2A-2D and FIGS. 3A-3B), 37a (FIGS. 4A-4B) and 74a (FIGS. 5A-5C) can be of specular or diffusive type, whereas, sidewall reflective coatings 34br and 39b are preferably of the specular type.

Figure 6A:
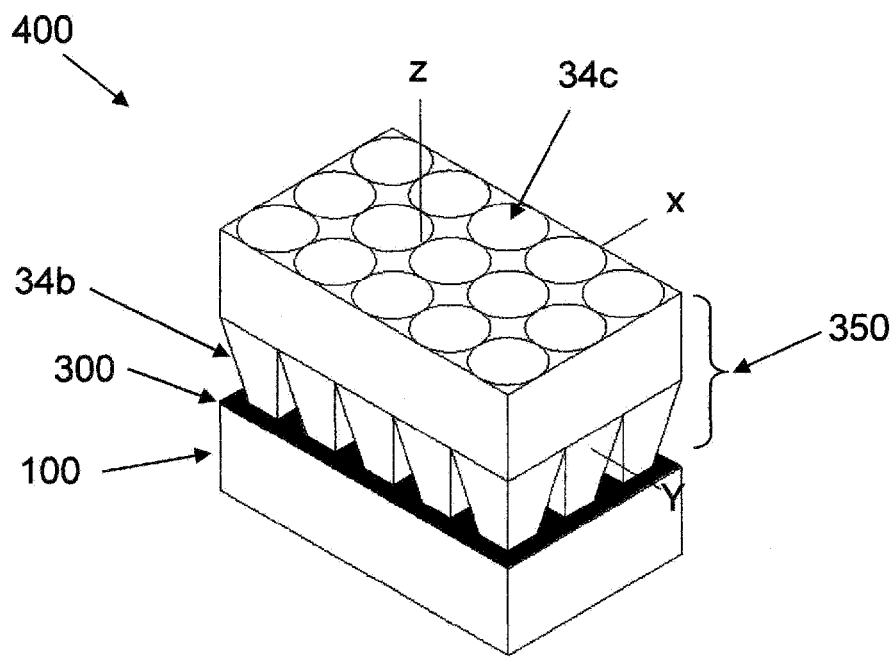
FIG. 6A shows a perspective view of a light extraction system having an extraction plate comprising micro-waveguide and optional micro-lens arrays attached to an LED having a patterned reflective coating formed thereon acting as a micro-aperture.
Figure 6B:
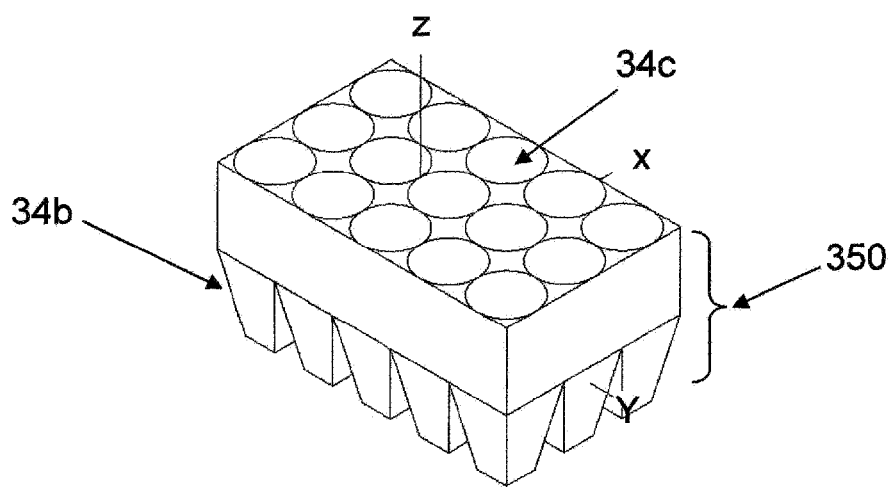
FIG. 6B shows an exploded view of the extraction system shown in FIG. 6A.
Figure 6B:
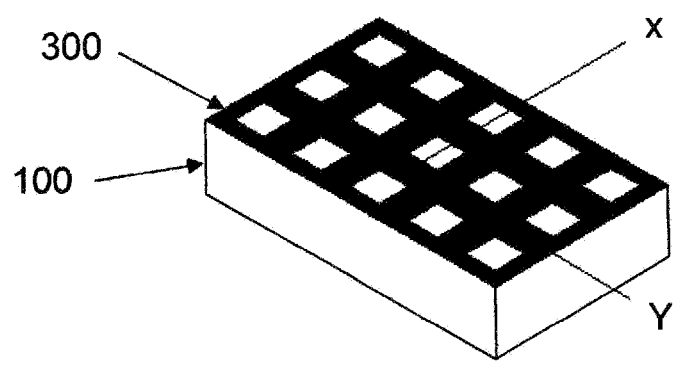
Figure 7A:
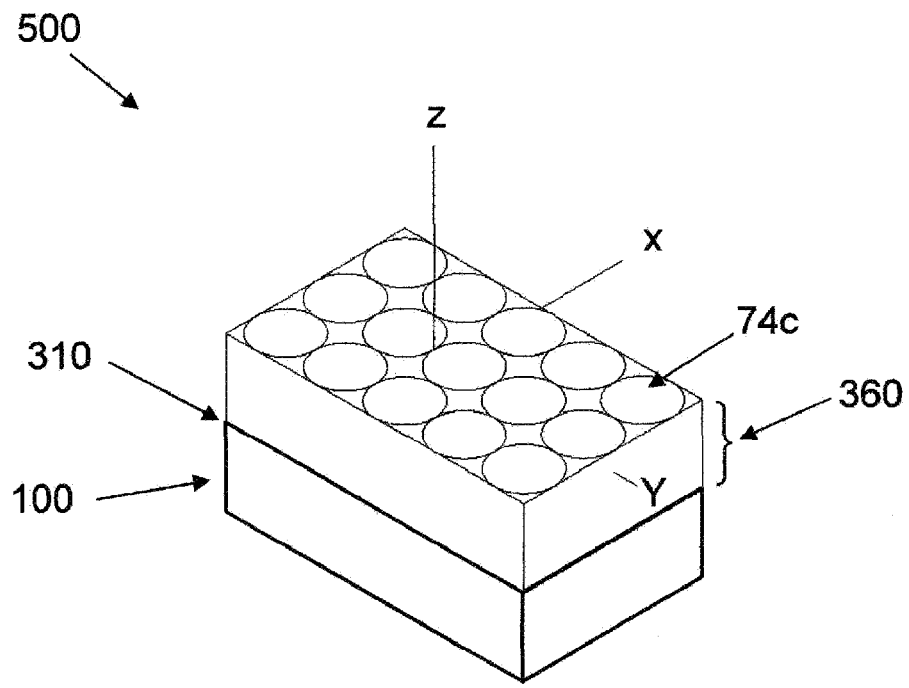
FIG. 7A shows a perspective view of a light extraction system having an extraction plate comprising a micro-lens array attached to an LED having a patterned reflective coating formed thereon acting as a micro-aperture.
Figure 7B:
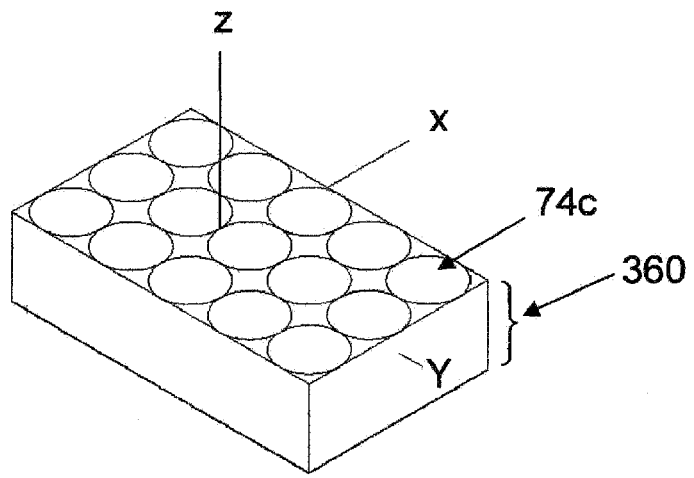
FIG. 7B shows an exploded view of the light extraction system shown in FIG. 7A.
Figure 7B:
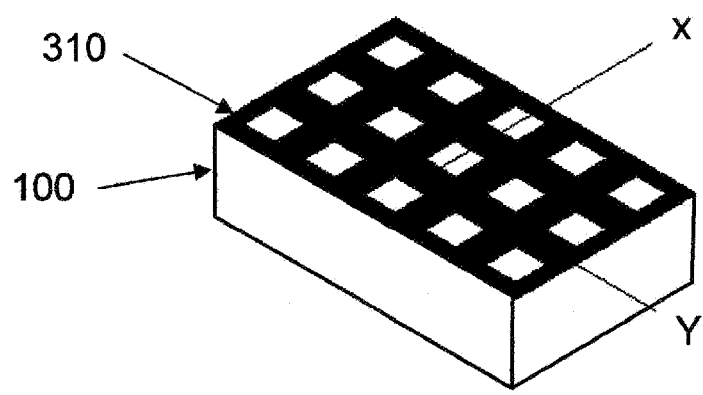

According to an alternative configuration of the light extraction system, the aperture array 34a (FIG. 2 and FIG. 3) and 74a (FIG. 5) is omitted, and instead, a highly reflective patterned coating 300 and 310 is applied directly to the emitting surface of the LED (or encapsulating epoxy) leading to extraction systems 400 and 500 as shown in FIG. 6 and FIG. 7, respectively.

Perspective integrated and exploded views of a light extraction system 400 are shown in FIG. 6A and FIG. 6B, respectively. Extraction plate 350 consists of a micro-waveguide array 34b and an optional micro-lens array 34c while the highly reflective patterned coating 300 is applied directly to the LED surface 110 or epoxy layer 120.

Perspective integrated and exploded views of an alternative light extraction system 500 are shown in FIG. 7A and FIG. 7B, respectively. Extraction plate 360 includes a micro-lens array 74c while the highly reflective patterned coating 310 is applied to the LED surface 110 or epoxy layer 120 directly.

The light extraction systems 400, 500 operate is substantially the same manner as described above for the light extraction systems 200, 250 depicted in FIGS. 1A-B.

The reflective coatings 300 and 310 applied to the LED emitting surface 100 or epoxy layer 120 can be of specular or diffusive type.

Antireflection coating (ARC) such as sub-wavelength structures or gratings can be applied to the front and/or back sides of the extraction plates described herein to reduce Fresnel reflections.

To manufacture the systems described herein, it is possible to use micro-tunnel and micro-waveguide arrays and fabrication techniques described in related U.S. patent application Ser. No. 10/458,390 filed on Jun. 10, 2003 to Nayef Abu-Ageel, which is incorporated by reference.

In addition, the optical element arrays disclosed herein can be made using various conventional manufacturing methods including, but not limited to, dry etch techniques such as reactive ion etch (RIE) technique, wet etch techniques such as the use of fluoride-based aqueous etching of Pyrex® substrates or the use of buffered oxide etch (BOE) to form optical elements in fused silica substrates. Additional fabrication techniques can use photosensitive glasses such as Foturan® produced by Schott Glass, Inc. or combine a spin-on glass (SOG) process and standard LIGA techniques. Further techniques include glass-drawing which is commonly used in fabricating micro-channel plates (MCPs), laser patterning techniques, nano-technology techniques and combinations of two or more of the foregoing techniques.

Advantages of light extraction systems disclosed herein include relative ease of manufacture, which is separate from the LED manufacturing process, enhanced extraction efficiency without adding complexity to LED design and fabrication, and improved control over the spatial distribution of emitted light in terms of angle and intensity.

While one or more specific embodiments of the invention have been described above, it will be apparent to those of ordinary skill in the art that many more embodiments are possible that are within the scope of the invention. Further, the foregoing summary, detailed description and drawings are considered as illustrative only of the principles of the invention. Since other modifications and changes may be or become apparent to those skilled in the art, the invention is not limited the exact constructions and operations shown and described above, and accordingly, all suitable modifications and equivalents are deemed to fall within the scope of the invention, the invention being defined by the claims that follow.

The invention claimed is:

1. An LED light extraction system, comprising:
   an extraction plate adapted to be bonded to a light-emitting surface of the an LED, the extraction plate including a plurality of optical elements arranged to receive and pass light emitted from the LED, the optical elements outputting collimated LED light that is more collimated than the LED-emitted light received by the optical elements; and
   a partially reflective layer between the light emitting surface of the LED and the optical elements, for passing a portion of the LED-emitted light into the optical elements and reflecting a portion of the LED-emitted light back into the LED;
   wherein the optical elements have a refractive index that is greater than or equal to the refractive index of the LED semiconductor material.

2. The LED light extraction system of claim 1, wherein the partially reflective layer includes a reflective coating having a plurality of light-transmissive apertures formed therein.

3. The LED light extraction system of claim 2, wherein the light-transmissive apertures have a one-to-one correspondence with the optical elements.

4. The LED light extraction system of claim 3, wherein the optical axis of each of the optical elements is aligned with a respective light-transmissive aperture.

5. The LED light extraction system of claim 1, wherein the entrance and exit apertures of the optical elements are about 5 μm-50 μm in diameter.

6. The LED light extraction system of claim 1, wherein the extraction plate is substantially planar, has an area substantially equal to the light emitting surface of the LED.

7. The LED light extraction system of claim 1, wherein the optical elements include an array of waveguides receiving the light emitted from the LED.

8. The LED light extraction system of claim 1, wherein the optical elements include an array of lens receiving the light emitted from the LED.

9. The LED light extraction system of claim 1, wherein the partially reflective layer is included in the extraction plate and includes:
   a light-transmissive plate located between the LED's light-emitting surface and the optical elements; and
   a reflective coating on the light-transmissive plate, the reflective coating having a plurality of light-transmissive apertures formed therein.

10. The LED light extraction system of claim 1, wherein the optical elements include an array of hollow tunnels receiving the light emitted from the LED.

11. A method of extracting collimated light from an LED, comprising:
   providing an extraction plate bonded to a light-emitting surface of the LED, the extraction plate including a plurality of optical elements arranged to receive and pass light emitted from the LED, the optical elements outputting the collimated LED light, which is more collimated than the LED-emitted light received by the optical elements;
   providing a partially reflective layer between the LED's light emitting surface and the optical elements for passing a portion of the LED-emitted light into the optical elements and reflecting a portion of the LED-emitted light back into the LED, the partially reflective layer comprising a reflective coating on the LED patterned to provide an array of light-emitting apertures that correspond to a predetermined array of the optical elements; and
   causing the LED to emit light.

12. An LED light extraction system, comprising:
   an LED having a light emitting surface;
   an encapsulating epoxy layer formed over the light emitting surface of the LED;
   a substantially planar extraction plate bonded to the encapsulating epoxy layer, the extraction plate including a plurality of optical elements arranged to receive and pass light emitted from the LED, the optical elements outputting collimated LED light that is more collimated than the LED-emitted light received by the optical elements; and
   a partially reflective layer between the LED's light emitting surface and the optical elements for passing a portion of the LED-emitted light into the optical elements and reflecting a portion of the LED-emitted light back into the LED.

13. The LED light extraction system of claim 12, wherein optical elements include an array of regularly spaced waveguides, each waveguide having an optical axis that is substantially orthogonal to the LED's light emitting surface, an entrance aperture receiving LED light emitted from a corresponding light-transmissive aperture formed in the partially reflective layer, sidewalls and an exit aperture.

14. The LED light extraction system of claim 13, wherein optical elements further include an array of regularly spaced lenses positioned over the array of waveguides, each of the lenses corresponding to one of the waveguides and being positioned over the exit aperture of the corresponding waveguide.

15. The LED light extraction system of claim 12, wherein optical elements include an array of regularly spaced lenses, each of the lenses having an optical axis that is substantially orthogonal to the LED's light emitting surface and positioned over a corresponding light-transmissive aperture formed in the partially reflective layer.

16. The LED light extraction system of claim 12, wherein the extraction plate includes an aperture array having formed thereon the partially reflective layer.

17. The LED light extraction system of claim 12, wherein the partially reflective layer is formed on the LED.

18. An LED light extraction system, comprising:
   an LED having a light emitting surface;
   a substantially planar extraction plate bonded to the LED's light emitting surface, the extraction plate including a plurality of optical elements arranged to receive and pass light emitted from the LED, the optical elements outputting collimated LED light that is more collimated than the LED-emitted light received by the optical elements; and
   a partially reflective layer formed on the LED's light emitting surface, for passing a portion of the LED-emitted light into the optical elements and reflecting a portion of the LED-emitted light back into the LED.

* * * * *